US00RE34797E

United States Patent [19]

Sato et al.

[11] E Patent Number: Re. 34,797

[45] Reissued Date of Patent: Nov. 22, 1994

[54] SEMICONDUCTOR MEMORY DEVICE HAVING A BACK-BIAS VOLTAGE GENERATOR

[75] Inventors: Katsuyuki Sato, Kodaira; Kazumasa Yanagisawa, Kokubunji, both of Japan

[73] Assignee: Hitachi, Ltd., Tokyo, Japan

[21] Appl. No.: 962,329

[22] Filed: Oct. 16, 1992

Related U.S. Patent Documents

Reissue of:

[64] Patent No.: 4,964,082
Issued: Oct. 16, 1990
Appl. No.: 249,660
Filed: Sep. 27, 1988

U.S. Applications:

[62] Division of Ser. No. 763,615, Aug. 8, 1985, Pat. No. 4,775,959.

[51] Int. Cl.[5] ..... G11C 7/02

[52] U.S. Cl. ..... 365/189.09; 365/189.01; 327/534

[58] Field of Search ..... 365/182, 226, 189.01, 365/189.09; 307/296.2

[56] References Cited

U.S. PATENT DOCUMENTS

| | | | |
|---|---|---|---|
| 4,258,310 | 3/1981 | Asakawa et al. | 307/297 X |
| 4,337,524 | 6/1982 | Parkinson | 365/229 |
| 4,438,346 | 3/1984 | Chuang et al. | 307/297 |
| 4,446,384 | 5/1984 | Taira | 307/297 |
| 4,585,955 | 4/1986 | Uchida | 307/297 |
| 4,616,346 | 10/1986 | Nakaizumi et al. | 365/229 |
| 4,631,421 | 12/1986 | Inoue et al. | 307/297 |
| 4,670,861 | 6/1987 | Shu et al. | 365/266 x |
| 4,769,787 | 9/1988 | Furusawa et al. | 365/184 |
| 4,780,854 | 10/1988 | Watanabe et al. | 307/297 X |
| 4,964,082 | 10/1990 | Sato et al. | 365/189.09 |

*Primary Examiner*—Terrell W. Fears
*Attorney, Agent, or Firm*—Antonelli, Terry, Stout & Kraus

[57] ABSTRACT

In typical MOS integrated circuit devices, the level of the back-bias voltage which is generated by a built-in back-bias generation circuit and is supplied to a semiconductor substrate is changed by an undesirable leakage current flowing through the semiconductor substrate. The leakage current is not constant. Instead, it becomes relatively small when a main circuit formed on the semiconductor substrate such as a dynamic RAM is not operative, and relatively great when such a circuit is operative. To reduce the change of the back-bias voltage resulting from the change of the leakage current, a back-bias voltage generation circuit is provided which has output capacity of a plurality of levels. Its output capacity is increased in response to an operation control signal of the main circuit. The level change of the back-bias voltage generation circuit can further be reduced by providing a level detection circuit for detecting the level change and a feedback circuit for controlling the back-bias voltage generation circuit in accordance with the output of the level detection circuit.

60 Claims, 4 Drawing Sheets

SEMICONDUCTOR MEMORY DEVICE HAVING A BACK-BIAS VOLTAGE GENERATOR

Matter enclosed in heavy brackets [ ] appears in the original patent but forms no part of this reissue specification; matter printed in italics indicates the additions made by reissue.

This is a divisional of application Ser. No. 763,615, filed Aug. 8, 1985, now U.S. Pat. No. 4,775,959.

BACKGROUND OF THE INVENTION

This invention relates generally to a semiconductor integrated circuit (IC) device. More particularly, the present invention relates to semiconductor circuit technique which is effective when applied, for example, to a semiconductor memory device incorporating therein a substrate bias generation circuit such as a dynamic RAM (Random Access Memory).

In semiconductor memory devices constituted by MOSFETs (Insulated Gate type Field Effect Transistors), it is known in the art to generate a substrate back-bias voltage by a built-in substrate back-bias generation circuit in order to reduce the parasitic capacitance between circuit elements such as MOSFETs and a semiconductor substrate in which the MOSFETs are formed. (For example, refer to "Nikkei Electronics", May 14, 1979, p.p. 77–79, published by Nikkei McGraw Hill Co.) When such a substrate bias generation circuit is incorporated, a power source voltage to be supplied to a semiconductor memory device can be unified to a voltage such as 5 V, and the number of external terminals therefor can be reduced.

As a result of studies, however, the inventors of the present invention have found that if a circuit for rectifying the output pulses generated continuously by an oscillation circuit is used in this case, the following problem develops. A current flowing to the substrate varies greatly between the accessing state in which each circuit starts operating simultaneously and the non-accessing state in which no internal circuit operates. Therefore, when the substrate back-bias voltage is generated by rectifying those oscillation pulses that are generated in no relation to circuit operation, the current supply capacity is essentially set in a "worst case" condition. This requires relatively large capacitor and rectification elements and a driving circuit, so that the integration density of the semiconductor integrated circuit is reduced. In addition, more current is drawn. (For details of the substrate bias generation circuit, refer to Japanese Patent Laid-Open No. 13566/1980, for example).

SUMMARY OF THE INVENTION

An object of this invention is to provide a semiconductor memory device having higher integration density and lower power consumption.

This and other objects and novel features of the present invention will become more apparent from the following description to be taken in conjunction with the accompanying drawings.

Among the inventions disclosed herein, a typical example is as follows. A level detection circuit is provided in order to control the operation of a substrate back-bias voltage generation circuit with the detection output of the level detection circuit when the level of substrate back-bias voltage exceeds a level having a predetermined absolute value.

DESCRIPTION OF THE PREFERRED EMBODIMENTS

[Embodiment 1]

Figure 1:
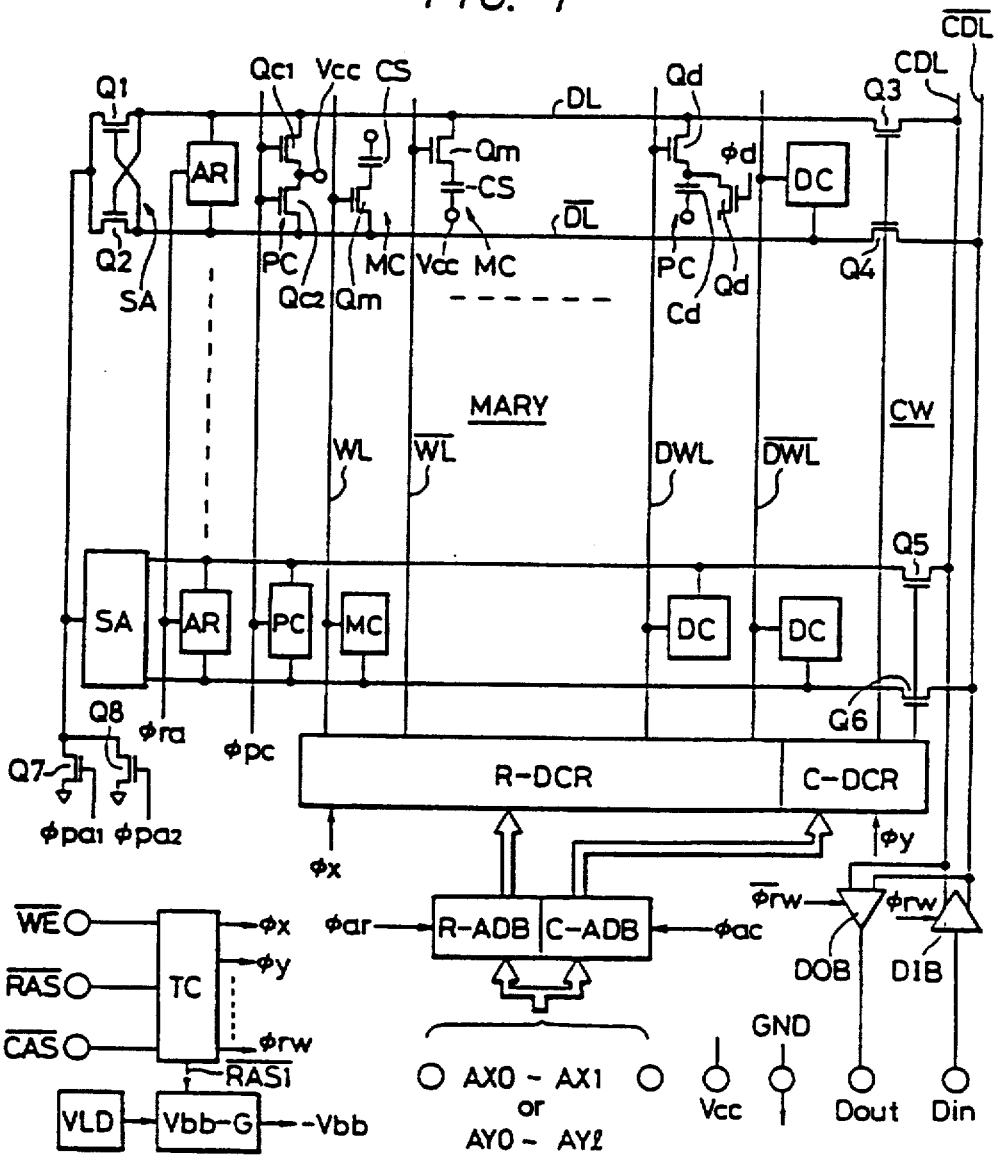
FIG. 1 is a circuit diagram showing one embodiment of the present invention.

FIG. 1 is a circuit diagram showing a dynamic RAM in accordance with one embodiment of the present invention. Each circuit element or each circuit block shown in the circuit diagram is formed on one semiconductor substrate such as single crystal silicon by a heretofore known production technique for semiconductor integrated circuits, though not particularly limited to that configuration. Various MOSFETs formed on the semiconductor substrate are in the enhancement mode. (This also applied to the other embodiments of the invention to be described later.)

A memory array MARY comprises a plurality of memory cells arranged in a matrix, a plurality of data line DL, $\overline{DL}$ and a plurality of word lines. Though not particularly limited to that configuration, the memory array MARY is of a folded bit line (data line) construction.

Each of the memory cells MC comprises a data storage capacitor $C_s$, one of the electrodes of which is connected to a reference potential point such as a power terminal of the circuit, and an address selection MOSFET Qm interposed between this capacitor $C_s$ and the data line. Logic "1" and "0" stored in the memory cells correspond to whether a charge is stored in the capacitor or not.

In the data read-out operation, each data line DL, $\overline{DL}$ of the memory array MARY is first pre-charged by a pre-charge circuit PC to a level substantially close of the power source voltage $V_{cc}$ of the circuit. The pre-charge circuit PC comprises, for example, of pre-charge MOSFETs $Q_{c1}$ and $Q_{c2}$ that are interposed between the data line DL, $\overline{DL}$ and the power terminal $V_{cc}$, respectively. The conduction of these pre-charge transistors MOSFETs $Q_{cl}$ and $Q_{c2}$ is controlled by a pre-charge pulse $\emptyset_{pc}$. The pre-charge circuit PC may include an equalizer MOSFET that is interposed between the pair of the data line DL, $\overline{DL}$ and is controlled by the pre-charge pulse $\emptyset_{pc}$, in addition to the pre-charge MOSFETs $Q_{c1}$ and $Q_{c2}$.

One of the plurality of word line WL of the memory array MARY is selected after each data line has been pre-charged. When a particular word line is selected, the MOSFETs $Q_m$ of the memory cell corresponding to the selected word line is turned on and the capacitor $C_s$ is coupled to the data line DL or $\overline{DL}$. Accordingly, the potential of the data line DL or $\overline{DL}$ to which the memory cell is connected is changed. The potential of the data line DL or $\overline{DL}$ in this case is changed in accordance with the charge quality stored in the capacitor $C_s$. This potential change of the data line is sensed by a sense amplifier SA.

In a memory array having a large capacity, each memory is fabricated so as to be smaller, and a large number of memory cells are coupled to the respective data line DL, $\overline{DL}$. Therefore, the ratio $C_s/C_o$ of the capacitor $C_s$ to the stray capacitor $C_o$ (not shown) of the common data line DL is extremely small. This means that the potential change applied to the data line DL or $\overline{DL}$ in response to the charge stored in the capacitor $C_s$, that is, a signal, is extremely weak.

Though not particularly limited to this configuration, this embodiment includes one dummy cell DC for each data line in the same way as in the well known dynamic RAM in order to detect such a weak signal. The dummy cell DC is fabricated under the same production conditions and with the same design constants as those of the memory cell MC except that the capacity of the capacitor $C_D$ of the dummy cell DC is half that of the capacitor $C_s$ of the memory cell MC. Before addressing, the capacitor $C_D$ is charged to ground potential by an MOSFET $Q_d$, that receives a timing signal $\phi_d$. Since the capacitance of the capacitor $C_D$ is half that of the capacitor $C_s$, the capacitor $C_D$ applies a reference voltage, which is substantially half of the read-out signal from the memory cell MC, to the corresponding data line. In the circuit diagram, the symbol SA represents a sense amplifier which amplifies the difference of such potential changes caused by addressing within a sense period that is determined by timing signals (sense amplifier control signals) $\phi_{pa1}$, $\phi_{pa2}$. (The operation of the sense amplifier will be described after.) The input and output nodes of the sense amplifier are coupled to a pair of complementary data lines DL and $\overline{DL}$ that are arranged in parallel with each other. The number of the memory cells that are connected to these complementary data lines DL, $\overline{DL}$, respectively, are made to be equal in order to improve the data detection accuracy at the time of the data read-out operation.

When the memory cells MC connected to one of the complementary data line DL, $\overline{DL}$ are selected during addressing, one of a pair of dummy word lines DWL, $\overline{DWL}$ is selected so that the dummy cells connected to the other of the data lines are selected correspondingly.

The sense amplifier SA includes a pair of MOSFETs $Q_1$, $Q_2$ whose gates and drains are cross-connected, and differentially amplifies a weak signal appearing across the complementary data lines DL, $\overline{DL}$ by those MOSFETs. This amplification operation is divided into two stages by an MOSFET $Q_7$ having relatively small conductance and a MOSFET $Q_8$ having relatively large conductance. When the MOSFET $Q_7$ is rendered conductive by a relatively quick timing $\phi_{pa1}$, the amplification operation of the first stage is actuated in response thereto, and the amplification of the second stage is started at the time at which the potential difference between the complementary data lines DL, $\overline{DL}$ becomes great to a certain extent and a timing signal $\phi_{pa2}$ is generated. In other words, when the MOSFET $Q_8$ is rendered conductive by the timing signal $\phi_{pa2}$, the amplification operation of the second stage is started in response thereto. The two stage operation of the sense amplifier SA makes it possible to effect amplification devoid of any error of the potential difference between the complementary data lines DL, $\overline{DL}$ and to effect amplification at a higher operating speed. As a result of the amplification operation by the sense amplifier SA, one of the pair of data lines is set to a potential somewhat lower than the power source voltage $V_{cc}$ while the other is set to a low potential substantially equal to the ground potential (0 V) of the circuit.

The stored data of the memory cell, which is once about to be destroyed when addressing is effected, is restored as the high or lower level potential obtained by this sense operation is as such supplied to the memory cell MC. In other words, the stored data that has temporarily been read out is written once again into the memory cell.

An active restore circuit AR is disposed between the complementary data lines DL and $\overline{DL}$ in order to raise the high level potential re-written into the memory cell MC to a level that is substantially equal to the power source voltage $V_{cc}$ of the circuit. This active restore circuit AR has the function of selectively boosting only the high level signal to the power source voltage $V_{cc}$ without affecting at all the low level signal. The explanation in detail of the definite circuit construction of this active restore circuit AR is omitted hereby because it is not directly relevant to the gist of the present invention.

A column switch CW comprising of MOSFETs $Q_3$ and $Q_4$ is interposed between the pari of data lines DL, $\overline{DL}$ and the pair of common complementary data lines CDL, $\overline{CDL}$. Similary, another column switch CW comprising of a similar MOSFETs $Q_5$ and $Q_6$ is interposed between the other data line pair and the common complementary data line pair CDL, $\overline{CDL}$. The input terminals of a data output buffer DOB including an output amplifier and the output terminal of a data input buffer DIB are connected to the common complementary data line pair CDL, $\overline{CDL}$.

A row decoder R-DCR and a column decoder C-DCR receive internal complementary address signals generated by address buffers R-ADB and C-ADB, and generate a selection signal for selecting one word line and one dummy word line as well as column switch selection signal to be applied to the column switches. Addressing to the memory cells and to the dummy cells is effected in this way.

The operations of the address buffers R-ADB and C-ADB are controlled by timing signal $\phi$ar and $\phi$ac, respectively, and the operations of the row and column decoders R-DCR and C-DCR are controlled by timing signals $\phi_x$ and $\phi_y$, respectively. In other words, external address signals $AX_o$–$AX_i$ are taken in by the row address buffer R-ADB in synchronism with the timing signal $\phi_{ar}$ that is formed on the basis of a row address strobe signal $\overline{RAS}$, and the internal address signals generated by the address buffer R-ADB are transferred to the row decoder R-DCR. The address decoder R-DCR decodes the internal address signal supplied from the row address buffer ADB, and sets one word line and one dummy word line to a selection level at a timing in accordance with a word line access timing signal $\phi_x$.

External address signal AYo–AYl are taken in by the column address buffer C-ADB in synchronism with the timing signal $\phi_{ac}$ formed on the basis of the column address strobe signal $\overline{CAS}$ and are transferred to the column decoder C-DCR. The column decoder C-DCR generates a column selection signal for selecting a predetermined data line at the timing in accordance with a data line selection timing signal $\phi_y$.

A timing control circuit TC receives the row address strobe signal $\overline{RAS}$, the column address strobe signal $\overline{CAS}$ and a write enable signal $\overline{WE}$ that are supplied from external terminals, and generates various timing signals necessary for the memory operation besides the timing signals described above as the typical examples.

The address buffer, address decoder and data output buffer DOB of the column system comprise CMOS (complementary MOS) type static circuits, though they are not particularly limited to this configuration in order to accomplish the lower power consumption of the device and to accomplish continuous read-out operations by bringing the word lines into the accessing state and changing over the column address signals.

A substrate bias generation circuit $V_{bb}$-G is actuated by a positive power source voltage such as 5 V that is applied across the power terminal $V_{cc}$ as one of the external terminals of the integrated circuit and the reference potential terminal (or the ground terminal) GND, and generates a negative bias voltage.

The bias voltage produced from the substrate bias generation circuit $V_{bb}$-G is supplied to semiconductor regions which are act as a common substrate gate of MOSFET Qm in the memory array and MOSFETs constituting the circuit blocks shown in the drawing.

The CMOS integrated circuit of this embodiment is formed on the semiconductor substrate which consists of single crystal P-type silicon, but it is not particularly limited to this configuration.

Though not particularly limited to this configuration, an N-channel MOSFET such as MOSFET $Q_m$ in the memory array MARY is constructed from an N-type source region and an N-type drain region, both formed on the surface of the semiconductor substrate, and a gate electrode which is formed on the surface of the semiconductor substrate between the source region and the drain region via a thin gate insulating film, and which comprises of polysilicon. A P-channel MOSFET is formed on an N-type well region formed on the surface of the semiconductor substrate. Thus, the semiconductor substrate constitutes a common substrate gate for a plurality of N-channel MOSFETs formed thereon. The N-type well region constitutes the substrate gate of the P-channel MOSFET formed thereon. The substrate gate of the P-channel MOSFET, that is, the N-type well region, is coupled to the power terminal $V_{cc}$ of FIG. 1.

Among the main surface of the semiconductor substrate, the surface portions other than the surface portions to serve as the active regions, that is, the surface portions other than the surface portions on which MOSFETs, MOS capacitors and semiconductor wiring regions are to be formed, as covered by a relatively thick field insulating film, though the film is not shown in the drawing. The necessary wiring layer is extended onto the field insulating film or is extended onto the active regions via an insulating film.

According to the construction described above, the back-bias voltage $-V_{bb}$ produced from the substrate bias generation circuit $V_{bb}$-G is supplied to the common substrate gate of the N-channel MOSFETs formed on the surface of the semiconductor substrate.

The back-bias voltage reduces the junction capacitance formed by the P-N junction between the source-drain regions of the N-channel MOSFETs and the semiconductor substrate and by the P-N junction between the semiconductor wiring regions and the semiconductor substrate. Since the parasitic capacitance which limits the operating speed is thus reduced, the integrated circuit can operate at a higher speed.

MOSFETs such as the address selection MOSFETs $Q_m$ sometimes generate a tailing current or leakage current even when they are turned off. The threshold voltage of the MOSFET is increased suitably due to the substrate bias effect when the back-bias voltage $-V_{bb}$ is applied, so that the leakage current decreases. Since the leakage current of the address selection MOSFET $Q_m$ is reduced, the retention time of the charge stored in the data storage capacitor $C_s$ is relatively prolonged.

A structure of an integrated circuit consisting of a field insulating film and a wiring layer such as a signal wiring layer extending on the field insulating film can be regarded as constituting a part of the parasitic MOSFET structure. The back-bias voltage $-V_{bb}$ increases the threshold voltage of the parasitic MOSFET and prevents the operation of the parasitic MOSFET.

As is well known in the art, the proportion of the increase of the threshold voltage of MOSFET due to the substrate bias effect decreases with a higher substrate bias voltage. Therefore, the threshold voltage of each N-channel MOSFET remains within a relatively narrow range when the back-bias voltage $-V_{bb}$ is generated, irrespective of the variance of the characteristics of the MOSFETs resulting from the variance developing during the fabrication of the integrated circuit.

As will be more obvious from the description appearing later, the substrate bias generation circuit $V_{bb}$-G periodically generates the bias voltage due to the charge pump action utilizing the capacitor. The back-bias voltage is smoothed by the parasitic capacitance and the stray capacitance that exist between the semiconductor substrate to which it is applied, and the power source wiring layer, the semiconductor regions, and the like, The back-bias voltage which is retained substantially by the capacitance is reduced by a leakage current that develops between the source-drain region of MOSFET and the semiconductor substrate.

Here, the leakage current for the semiconductor substrate is not always constant, but is affected by the circuit operation. This leakage current is relatively small so long as the switching state of MOSFET remains unaltered and is kept fixed or stationary. Conversely, if the switching state of MOSFET changes, the leakage current is increased by such a change. For details of the mechanism of occurrence of the leakage current to the substrate, see "Physics of Semiconductor Devices", p.p. 480–487 by S. M. Sze, published by John Wiley & Sons, 1981.

In the dynamic RAM shown in FIG. 1, the substrate leakage current increases when the timing control circuit TC, the address buffers, the decoders, the sense amplifier and the like operate on the basis of the row address strobe signal $\overline{RAS}$, the column address strobe signal $\overline{CAS}$, and the like.

In accordance with this embodiment, the substrate bias generation circuit $V_{bb}$-G has a relatively large driving capacity so that it can keep the substrate bias potential at a suitable value even when the substrate leakage current increases. The circuit $V_{bb}$-G is also designed so as to exhibit low power consumption characteristics.

Though not particularly limited to this configuration, the substrate bias generation circuit $V_{bb}$-G of this embodiment includes a circuit portion exhibiting a steady operation and a circuit portion exhibiting an intermittent operation, from the aspect of its driving capacity and its power consumption. The circuit portion exhibiting the steady operation is provided with the driving capacity such that when each circuit shown in FIG. 1 is substantially in the non-operating state, it can keep the back-bias voltage $-V_{bb}$ at a desired value.

The circuit portion exhibiting the intermittent operation is provided with a relatively large driving capacity so that the back-bias voltage can be kept at a desired values even when the substrate leakage current is increased.

A level detection circuit VLD such as shown in FIG. 1 is provided in order to control the operation of the circuit portion exhibiting the intermittent operation, the level detection circuit VLD detects the back-bias voltage $-V_{bb}$ and produces a signal for operating the circuit portion of the intermittent operation when the back-bias voltage is lower than a desired level.

Though not particularly limited to this configuration, the operation of the circuit portion exhibiting intermittent operation in the substrate bias generation circuit in accordance with this embodiment is also controlled by a relatively fast row system control signal $RAS_1$ which is produced from the timing control circuit TC on the basis of the external control signal $\overline{RAS}$.

This construction makes it possible to obtain the following circuit operations.

When the access to the dynamic RAM of this embodiment is started by the row address strobe signal $\overline{RAS}$, the circuits shown in the drawing start operating in response thereto, and the substrate leakage current therefore increases. The level of the back-bias voltage $-V_{bb}$ becomes lower with an increasing substrate leakage current. In this case, the back-bias voltage is controlled in such a manner as to again assume the desired level by a feedback route consisting of the level detection circuit VLD and the circuit portion exhibiting the intermittent operation, even when the operation control of the substrate bias generation circuit by the control signal $RAS_1$ does not exist. In this case, however, the time required before the back-bias voltage returns to the desired level becomes somewhat long in accordance with the change of speed of the output of the circuit portion exhibiting the intermittent operation.

Conversely, when the control signal $RAS_1$, that is, the control signal having a quicker timing among the row system control signals produced from the timing control circuit TC, is utilized as in this embodiment, the operation of the circuit portion exhibiting intermittent operation can be started at the timing which is substantially the same as the timing at which the substrate leakage current is drastically increased. As a result, the drastic level change of the back-bias voltage can be prevented.

When the circuit portion of the substrate bias generation circuit $V_{bb}$-G exhibiting the intermittent operation is controlled by a control signal such as the control signal $RAS_1$, the level detection circuit VLD can be omitted. However, the following must be taken into consideration in such a case.

It is preferred that the back-bias voltage can change from 0 volt to the desired level within a relatively short period after the power source has been turned on. To speed up the generation of the back-bias voltage at the time the power source-is turned on, it becomes necessary that the circuit portion exhibiting the intermittent operation in the substrate bias generation circuit $V_{bb}$-G be also operated. For this purpose, the row address strobe signal for executing the dummy operation cycle must be applied to the external terminal $\overline{RAS}$ at the same time that the power is turned on.

When the detection output of the level detection circuit VLD is utilized, the circuit portion exhibiting the intermittent operation is immediately rendered operative by the detection output, so that the back-bias voltage is changed to the predetermined level within a relatively short period from the time that the power source is turned on, irrespective of the signal applied to the external terminal $\overline{RAS}$.

When the output of the level detection circuit VLD is not utilized, the level of the back-bias voltage might be reduced undesirably due to the increase of the substrate leakage current resulting from the rise of the operating temperature of the integrated circuit.

Figure 2:
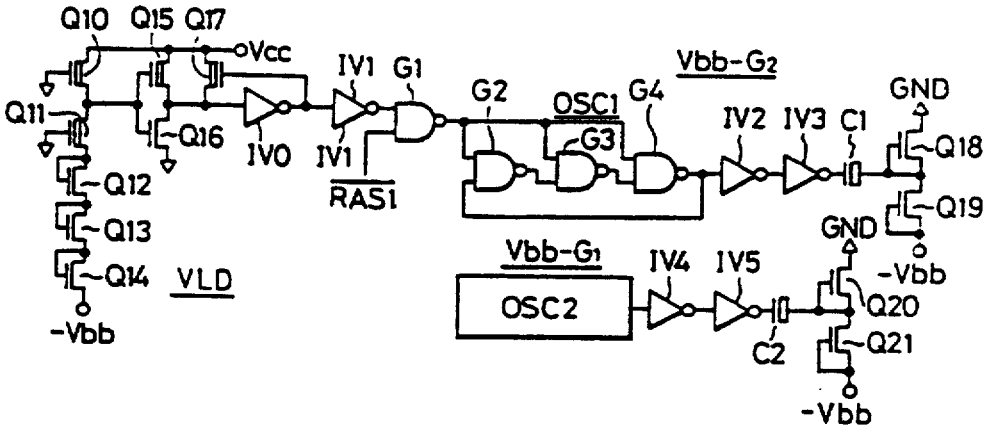
FIG. 2 is a circuit diagram showing an example of the substrate back-bias voltage generation circuit of the embodiment shown in FIG. 1.

FIG. 2 is a circuit diagram showing an example of the substrate bias generation circuit $V_{bb}$-G together with that of the level detection circuit VLD described above. In this circuit diagram, those MOSFETs which are provided with straight lines between their sources and drains are of the P-channel type, while those MOSFETs which are expressed by ordinary symbols are of the N-channel type.

In this embodiment, two kinds of substrate back-bias voltage generation circuits, that is, a substrate bias voltage generation circuit $V_{bb}$-G1 constituting the circuit portion of the steady operation and a substrate bias voltage generation circuit $V_{bb}$-G2 constituting the circuit portion of the intermittent operation, are provided. The back-bias voltage generation circuit $V_{bb}$-G1 of the steady operation comprises of an oscillation circuit OSC2, CMOS inverter circuits IV4, IV5 for waveform shaping and amplifying the output of the oscillation circuit and a rectification circuit.

The oscillation circuit OSC2 comprises, for example, of a ring oscillator which is operated by the power source voltage $V_{cc}$ and comprises of a plurality of CMOS inverter circuits that are coupled with one another in a ring configuration.

The rectification circuit comprises of a charge pump capacitor C2 and MOSFETs $Q_{20}$, $Q_{21}$ whose gate electrodes are connected to their drain electrodes (which operate either as the drain electrodes or as the source electrodes depending upon the polarity of the voltage applied thereto, but are called hereby the drain electrodes) so that the transistors function as the rectification elements. Though not particularly limited to this configuration, the capacitor C2 has an MOS capacitor structure having a similar structure to the N-channel MOSFET. In other words, one of the electrodes of the capacitor which should correspond to the gate electrode of the MOSFET is coupled to the output terminal of the CMOS inverter circuit $IV_5$ as the output buffer. The other of the electrodes of the capacitors $C_2$, that is, the electrodes that should correspond to the source or drain electrode of the MOSFET, is coupled to the common junction between the MOSFETs $Q_{20}$ and $Q_{21}$.

The MOSFET $Q_{20}$ which acts as the rectification element is interposed between the other electrode of the capacitor $C_2$ and the grounding point GND of the circuit, and the MOSFET $Q_{21}$ is disposed between the other electrode of the capacitor $C_2$ and the semiconductor substrate.

A parasitic capacitance $C_{sb}$ (not shown), that retains substantially the back-bias voltage, exists between the substrate and the grounding point of the circuit.

The MOSFET $Q_{20}$ of the diode form is turned on when the oscillation pulse produced from the inverter circuit IV5 is at the high level (substantially at the level of the power source voltage $V_{cc}$), and the capacitor $C_2$ is pre-charged by the output high level. Next, when the output pulse is at the low level (substantially at the level of the ground potential of the circuit), the other electrode of the capacitor $C_2$ is at a negative potential of $-(V_{cc}-V_{th})$. Here, the symbol $V_{th}$ represents the threshold voltage of the MOSFET $Q_{20}$. The MOSFET $Q_{21}$ of the diode form is turned on by this negative potential and transmits the negative potential to the parasitic capacitance $C_{sb}$ described above. Therefore, the substrate bias voltage $-V_{bb}$ is applied to the substrate. The substrate bias voltage generation circuit $V_{bb}$-$G1$ of the steady operation has a relatively small current supply capacity such that when the RAM described above is under the chip non-selection state, it can compensate for the leakage current flowing through the substrate.

The current supply capacity of the substrate bias voltage generation circuit $V_{bb}$-G1 of the steady operation is determined substantially by the capacitance of the capacitor $C_2$ and the oscillation frequency of the oscillation circuit OSC. In other words, the quantity of the charge injected into the semiconductor substrate in response to one oscillation output becomes greater with with a greater capacitance of the capacitor $C_2$. The number of times of the charge injection into the semiconductor substrate per unit time becomes greater with a higher oscillation frequency of the oscillation circuit $OSC_2$.

In accordance with this embodiment, the substrate bias voltage generation circuit of the steady operation is constituted in such a fashion as to exhibit low power consumption characteristics while securing a necessary and relatively small current supply capacity. The oscillation frequency of the oscillation circuit $OSC_2$ is set to be a relatively low value such as 1 or 2 MHz by selecting a suitable number of CMOS inverter circuits forming the oscillation circuit and by setting their signal delay characteristics to suitable levels.

Here, the power consumed by the oscillation circuit $OSC_2$ is proportional to the oscillation frequency. The operation current or consumed current of each CMOS inverter circuit constituting the oscillation circuit $OSC_2$ is proportional to a so-called "transient current" necessary for the charge and discharge of the load capacitance (consisting of wiring capacity, input capacitance of inverter circuits of the post stage and the like) coupled to the output of each inverter circuit in the same way as in the well known CMOS inverter circuit, and is substantially zero in the stationary state in which the output or input of each inverter is at the high or low level. Since the transient current of each CMOS inverter circuit is proportional to the operation frequency, the power consumption of the oscillation circuit $OSC_2$ having a low oscillation frequency is low.

In accordance with this embodiment, the driving capacity of the CMOS inverter circuit $IV_5$ as the output buffer for driving the rectification circuit may be relatively small because the capacitor $C_2$ is relatively small. Therefore, the P- and N-channel MOSFETs, not shown, constituting this CMOS inverter circuit $IV_5$ need not have low ON resistance; hence, may be small. The P- and N-channel MOSFETs, not shown, constituting the CMOS inverter circuit $IV_4$ as the waveform shaping circuit need only drive a load having a relatively small capacitance because the MOSFETs constituting the CMOS inverter circuit $IV_5$ are small. Therefore, the MOSFETs constituting the CMOS inverter circuit $IV_4$ may be small.

The substrate bias generation circuit $V_{bb}$-G2 for intermittent operation comprises a controllable oscillation circuit, that is, an oscillation circuit $OSC_1$ capable of the intermittent operation, a CMOS inverter circuit $IV_2$ as a waveform shaping circuit, a CMOS inverter circuit $IV_3$ as an output buffer and a rectification circuit.

Though not particularly limited to this configuration, the oscillation circuit $OSC_1$ comprises of CMOS NAND gate circuits $G_2$ through $G_4$. The output terminals of these gate circuits $G_2$–$G_4$ are connected to one of the input terminals of a gate circuit of the post stage. The output terminal of the gate circuit $G_4$ of the final stage is connected to one of the input terminals of the gate circuit $G_2$ of the initial stage. The other input terminal of each of the gate circuits $G_2$–$G_4$ is regarded as a common operation control terminal and is connected to the output terminal of the gate circuit $G_1$.

Each of the gate circuits $G_2$–$G_4$ constituting the oscillation circuit $OSC_1$ operates substantially as an inverter when the control signal supplied to the operation control terminal is at the high level (logic "1") such as one that is substantially equal to the power source voltage $V_{cc}$. Therefore, the oscillation circuit $OSC_1$ performs the oscillation operation as a ring oscillator. When the control signal is at the low level (logic "0") such as one that is substantially equal to the ground potential, the output of each of the gate circuits $G_2$–$G_4$ is kept fixed at the high level which is substantially equal to the power source voltage $V_{cc}$.

The rectification circuit comprises of a capacitor $C_1$ and MOSFETs $Q_{18}$, $Q_{19}$ as shown in the drawing.

When the oscillation circuit $OSC_1$ is rendered operative by the high level of the control input, the rectification circuit comprising of the capacitor $C_1$ and the MOSFETs $Q_{18}$, $Q_{19}$ is operated in response to the former, and the charge for applying a back-bias voltage is injected into the semiconductor substrate. The back-bias voltage in this case is determined by the substrate bias voltage generation circuit $V_{bb}$-$G_1$ of the steady operation with the substrate bias voltage generation circuit $V_{bb}$-$G_2$.

When the oscillation circuit $OSC_1$ is rendered inoperative by the low level of the control input, the rectification circuit comprising the capacitor $C_1$ and the MOSFETs does not operate. In this case, the output of the CMOS inverter circuit $IV_3$ is kept at the high level substantially equal to the power source voltage $V_{cc}$ by the high level output of the oscillation circuit $OSC_1$. The capacitor $C_1$ is kept in the charge state by the high level output of the inverter $IV_3$. This construction makes it possible to inject the charge into the substrate at an early timing when the oscillation circuit $OSC_1$ starts operating.

The CMOS NAND gates $G_2$–$G_4$ constituting the oscillation circuit $OSC_1$ do not consume current so long as they are in the stationary state, in the same way as the CMOS inverter circuit. Therefore, the power consumed by the substrate bias voltage generation circuit $V_{bb}$-$G_2$ of the intermittent operation is substantially zero during the period in which the oscillation circuit $OSC_1$ stops operating.

The substrate back-bias voltage generation circuit $V_{bb}$-$G_2$ operating intermittently must have a relatively large current supply capacity so that it can compensate for a relatively large leakage current that flows to the substrate when the RAM is in the operative state. Therefore, the capacitance of the capacitor $C_1$ is relatively large, while the oscillation frequency of the oscillation circuit $OSC_1$ is relatively large such as from 10 to 15 MHz.

The P- and N-channel MOSFETs, not shown, that constitute the CMOS inverter circuit $IV_3$ are relatively large because the rectification circuit constitutes a relatively heavy load. The P- and N-channel MOSFETs, not shown, that constitute the CMOS inverter circuit $IV_2$ are relatively large so that they can sufficiently drive the CMOS inverter circuit $IV_3$.

This embodiment includes a level detection circuit VLD comprising of MOSFETs $Q_{10}$–$Q_{17}$ and CMOS inverter circuits $IV_o$, $IV_1$, and a control circuit comprising of the CMOS NAND gate circuit $G_1$ in order to operate the substrate bias voltage generation circuit $V_{bb}$-$G_2$ only when the operation is necessary.

The level detection circuit VLD is provided in order to positively detect excess substrate back-bias voltage $-V_{bb}$ beyond a predetermined level necessary for high speed operation of the RAM. In the level detection circuit VLD, the ground potential of the circuit is steadily applied to the gate of the P-channel MOSFET $Q_{10}$ so that the transistor serves as a constant current load. In other words, the MOSFET $Q_{10}$ is constantly turned on. A P-channel MOSFET $Q_{11}$ for level clamping is connected in series with this MOSFET $Q_{10}$. Since the ground potential of the circuit is constantly applied to the gate, this MOSFET $Q_{11}$ is constantly kept ON. Therefore, the source potential of the MOSFET $Q_{11}$, that is, the potential of the electrode coupled to the drain of the MOSFET $Q_{10}$, is at the level which is higher than at least the ground potential of the circuit, and the drain potential is substantially equal to the ground potential of the circuit. MOSFETs $Q_{12}$–$Q_{14}$ in the diode form are connected in series between the drain of the MOSFET $Q_{11}$ and the substrate ($-V_{bb}$).

Therefore, the detection level of the level detection circuit VLD is substantially equal to the sum 3 $V_{th}$ of the threshold voltages $V_{th}$ of the three MOSFETs $Q_{12}$ through $Q_{14}$ connected in series. If the substrate back-bias voltage $-V_{bb}$ is at the level lower than the total threshold voltage $3V_{th}$ of the three transistors $Q_{12}$–$Q_{14}$ in the diode form, these transistors are turned off. In this case, the potential at the junction between the MOSFETs $Q_{11}$ and $Q_{10}$ is at the high level such as the power source voltage $V_{cc}$. If the substrate back-bias voltage $-V_{bb}$ is at the level higher than the level of the total threshold voltage $3V_{th}$ of the MOSFETs $Q_{12}$–$Q_{14}$ in the diode form, these transistors $Q_{12}$–$Q_{14}$ are turned on. In this case, the potential at the junction between the MOSFETs $Q_{11}$ $Q_{10}$ is at the low level which is higher by the threshold voltage $V_{th}$ of the MOSFET $Q_{11}$ than the ground potential of the circuit. In this case, the current flowing from the power source terminal $V_{cc}$ to the substrate positively reduces the substrate back-bias voltage $-V_{bb}$.

The conductance of the load MOSFET $Q_{10}$ is set to an extremely small value in order to minimize the current flowing to the substrate through the level detection circuit and to sufficiently reduce the low level appearing at the junction between the MOSFETs $Q_{10}$ and $Q_{11}$. In other words, the conductance is set to an extremely small conductance so that the MOSFET $Q_{10}$ permits the flow of only a slight current.

The high and low levels of the detection output such as described above are judged by a CMOS inverter circuit constituted by a P-channel MOSFET $Q_{15}$ and an N-channel MOSFET $Q_{16}$. Though not particularly limited to this configuration, the inverter circuit comprising the MOSFET $Q_{15}$ and $Q_{16}$ forms a Schmidt circuit (hysteresis circuit) together with a MOSFET $Q_{17}$ and a CMOS inverter circuit $IV_o$ in order to realize a high speed charge of the detection output to be obtained and particularly, to operate the oscillation circuit $OSC_1$ rapidly when the back-bias voltage is reduced. In other words, the output of the inverter circuit comprising of the MOSFETs $Q_{15}$ and $Q_{16}$ is applied to the input of the CMOS inverter circuit $IV_o$ having a similar construction. The output of this CMOS inverter circuit $IV_o$ is applied to the gate of the P-channel MOSFET $Q_{17}$ disposed between its input and the power source voltage $V_{cc}$, thereby effecting positive feedback. When the low level detection output is formed, the detection signal produced from the inverter circuit $IV_o$ is changed to the low level at a high speed. The detection output generated by this inverter circuit $IV_o$ is applied to one of the input terminals of the CMOS NAND gate circuit $G_1$ through the CMOS inverter circuit $IV_1$. The internal row address strobe signal $RAS_1$ formed by the timing control circuit TC shown in FIG. 1 is applied to the other input terminal of this NAND gate circuit $G_1$. The output of this NAND gate circuit $G_1$ is applied in common to the other input terminals of the NAND gate circuits $G_2$–$G_4$ that constitute the ring oscillator $OSC_1$ described above.

Figure 3:
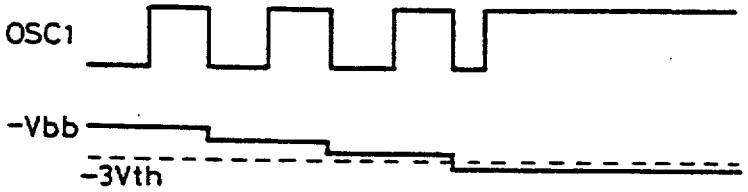
FIG. 3 is a timing chart useful for explaining the operation of the substrate back-bias voltage generation circuit.

Next, the operation of the circuit of this embodiment will be described with reference to the timing chart of FIG. 3.

When the RAM is in the chip non-selecting state or when the internal address strobe signal $RAS_1$ is at the high level, the output of the gate circuit $G_1$ responds to the detection output of the level detection circuit VLD.

Under this chip non-selecting state, if the absolute value of the substrate back-bias voltage $-V_{bb}$ is less than that of the total threshold voltage 3 $V_{th}$ of the three MOSFETs $Q_{12}$ through $Q_{14}$ described already, these transistors are turned off; hence, the detection output is at the high level. Therefore, the detection output supplied to the NAND gate circuit $G_1$ is at the low level (logic "0"), and the output of the NAND gate circuit $G_1$ is at the high level (logic "1"), whereby the oscillation circuit of the substrate back-bias voltage is increased by the rectification circuit that receives the output pulses of the oscillation circuit. When the substrate back bias voltage $-V_{bb}$ exceeds the total threshold voltage $3V_{th}$, the MOSFETs $Q_{12}$–$Q_{14}$ are turned on, so that the detection output is at the low level, whereupon the detection output supplied to the NAND gate circuit $G_1$ is at the high level (logic "1"). Since the output of the NAND gate circuit $G_1$ falls to the low level (logic "0") in response to the former, the outputs of all of the NAND gate circuits $G_2$–$G_4$ constituting the oscillation circuit OSC rise to the high level (logic "1"). In other words, oscillation stops.

Since oscillation stops, the operation of the rectification circuit ($C_1$,$Q_{18}$, $Q_{19}$) also stops. Since the oscillation circuit consuming much power and the rectification circuit thus stop operating, lower power consumption can be accomplished. Incidentally, since the substrate back-bias voltage is at a low level at or near ground potential immediately after turning on the power, the operations of both substrate back-bias voltage generation circuits can quickly raise the absolute value of the substrate back-bias voltage to the desired level.

When the row address strobe signal $\overline{RAS}$ falls to the low level and chip selecting is thus indicated, the internal signal is lowered to the low level in response thereto, so that the output of the NAND gate circuit $G_1$ rises to the high level (logic "1") irrespective of the detection output of the level detection circuit described above. When the RAM executes the write-in/read-out operations and the like, the oscillation circuit $OSC_1$ is rendered unconditionally operative. This is to prevent the drastic drop of the absolute value of the substrate back-bias voltage $-V_{bb}$ that is caused by a relatively great substrate leakage current occurring when RAM operations such as described above are started. If the oscillation circuit $OSC_1$ is rendered operative in advance before the RAM is rendered operative as in this embodiment, it becomes possible to prevent the drastic drop of the substrate back-bias voltage $-V_{bb}$.

[Embodiment 2]

Figure 4:
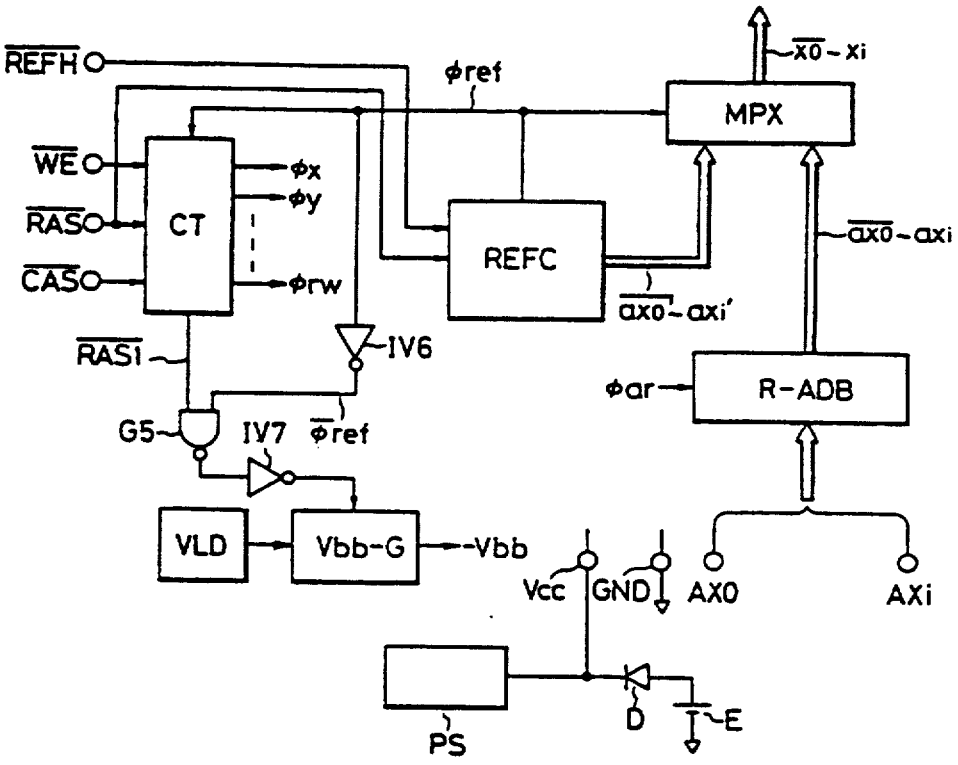
FIG. 4 is a circuit diagram showing another embodiment of the present invention.

FIG. 4 is a circuit diagram showing a dynamic RAM in accordance with the second embodiment of the invention. Those circuits which are not shown in FIG. 4 are substantially the same as those shown in FIG. 1.

The RAM in this embodiment includes a refresh control circuit REFC and a multiplexor MPX to accomplish the automatic refresh of memory cells.

The refresh control circuit REFC includes a refresh timer and a refresh address counter that are not shown.

The refresh timer is operated when the row address strobe signal $\overline{RAS}$ is raised to the high level and the refresh control signal $\overline{REFH}$ is lowered to the low level, that is, when the refresh operation is indicated in the chip non-selecting state, and produces periodically refresh control signals $\phi_{ref}$ during its operation.

The refresh address counter receives the control signals produced from the refresh timer as its advance pulses, and forms refresh address signal $ax_o$ through $ax_i$.

The operation of the multiplexor MPX is controlled by the control signal $\phi_{ref}$. The multiplexor MPX selects the internal address signals $ax_o$ through $ax_i$ produced from the address buffer R-ADB when the control signal $\phi_{ref}$ is not produced, and selects the refresh address signals $ax_o$ through $ax_i'$ when the control signal $\phi_{ref}$ is produced.

The timing control circuit TC generates various timing signals similar to those of the first embodiment in response to the row address strobe signal $\overline{RAS}$, the column address strobe signal $\overline{CAS}$, and the like that are supplied to the external terminals, in the same way as in the first embodiment. However, this embodiment is somewhat different from the first embodiment in that the internal circuit of the timing control circuit TC is constructed in such a fashion as to respond to the refresh control signal $\phi_{ref}$. When the refresh control signal $\phi_{ref}$ is generated, the timing control signal TC controls the operations of the row system circuits, that is, the row address decoder R-DCR, the pre-charge circuit PC, the sense amplifier SA and the active restore circuit AR, shown in FIG. 1, in response to the refresh control signal.

According to this construction, the refresh operation is effected whenever the refresh control signal $\phi_{ref}$ is generated. In other words, when the refresh control signal $\phi_{ref}$ is generated, the refresh address signals $ax_o$ through $ax_i$ of the refresh address counter are supplied to the row address decocer R-DEC of FIG. 1 through the multiplexor MPX in response to the refresh control signal $\phi_{ref}$. The control signal $\phi_{ref}$ actuates the timing control circuit TC, and the row system timing signals produced by the timing control circuit TC in turn actuate sequentially the pre-charge circuit PC, the row address decoder R-DCR, the sense amplifier SA and the active restore circuit AR of FIG. 1. As a result, the word line corresponding to the refresh address is selected, and the stored data of the memory cell coupled to the selected word line is refreshed.

The substrate bias voltage generation circuit $V_{bb}$-G and the level detection circuit VLD of this embodiment are substantially the same as those of FIG. 2.

In accordance with this embodiment, a logic synthesis circuit comprising of a CMOS gate circuit $G_5$ and CMOS inverter circuits $IV_6$ and $IV_7$ is provided so that the operation of the substrate bias voltage generation circuit $V_{bb}$-G is controlled by the refresh control signal $\phi_{ref}$, too. The output of this logic synthesis circuit is set to the low level at the time of chip selection (a period in which the row address strobe signal $\overline{RAS}$ is at the low level) and at the time of the refresh operation.

The circuit portion of the intermittent operation inside the substrate bias voltage generation circuit $V_{bb}$-G is operated synchronously when the substrate leakage current is increased by the execution of the refresh operation, that is, when the timing control circuit TC and the row system circuits are operated by the refresh control signal $\phi_{ref}$.

When battery back-up of a dynamic RAM is necessary, a power source device PS for forming a predetermined d.c. voltage from a commercial a.c. power source, for example, and a series circuit comprising of a battery E and a diode D are connected between the external terminal $V_{cc}$ and GND. When the power source device PS is cut off, the power source voltage required by the RAM for holding the information or data is supplied from the battery E.

In the dynamic RAM of this embodiment, the fresh operation at the time of battery back-up is automatically executed without requiring any external control signals, in particular. Therefore, the RAM does not require the operations of other external devices as the time of battery back-up.

Since the lower power consumption by the substrate bias voltage generation circuit $V_{bb}$-G can be accomplished, the power consumption of the dynamic RAM of this embodiment can be reduced as a whole. Therefore, the battery life for battery back-up can be extended.

[Embodiment 3]

Figure 5:
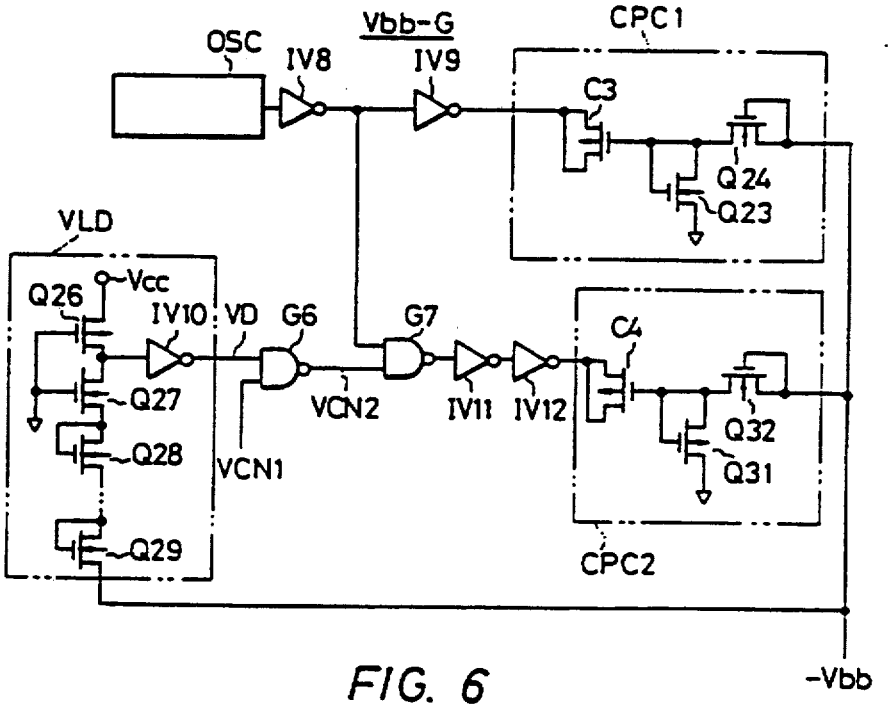
FIGS. 5 and 6 are circuit diagrams showing other embodiments of the present invention, respectively.

FIG. 5 is a circuit diagram showing a level detection circuit VLD and a substrate bias voltage generation circuit in accordance with still another embodiment of the invention.

The level detection circuit VLD comprises of a P-channel MOSFET $Q_{26}$, N-channel MOSFETs $Q_{27}$–$Q_{29}$ and a CMOS inverter circuit $IV_{10}$ as shown in the drawing. The substrate gate of the MOSFET $Q_{26}$ is connected to the power terminal $V_{cc}$ in the same way as in the foregoing embodiments. The substrate gates of the MOSFETs $Q_{27}$–$Q_{29}$ consist of the P-type semiconductor substrate.

The detection output VD of the level detection circuit VL is set to the high level substantially equal to the $V_{cc}$ level or to the low level substantially equal to 0 V in accordance with the level of the back-bias voltage $-V_{bb}$ in the same way as in the foregoing embodiments.

The CMOS NAND gate circuit $G_6$ receives the detection output VD of the level detection circuit VLD and the control signal $VCN_1$. The control signal $VCN_1$ is generated by an inverter circuit $IV_7$ shown in FIG. 4, for example. The output of the gate circuit $G_6$ is supplied to the substrate bias voltage generation circuit $V_{bb}$-G.

The substrate bias voltage generation circuit $V_{bb}$-G comprises of the common oscillation circuit OSC, a CMOS inverter circuit $IV_8$ which act as a waveform shaping circuit, a CMOS NAND gate circuit $G_7$, aCMOS inverter circuit $IV_{11}$, CMOS inverter circuits $IV_9$ and $IV_{12}$ as a buffer amplifier, and rectification circuits $CPC_1$ and $CPC_2$.

Since the output of the CMOS inverter circuit $IV_8$ is directly supplied to the input of the CMOS inverter circuit $IV_9$, the latter generates steady pulse signals. In consequence, the rectification circuit $CPC_1$ is operated steadily.

The output of the CMOS inverter circuit $IV_8$ is supplied to the input of the CMOS inverter circuit $IV_{12}$ through the gate circuit $G_7$ and the CMOS inverter circuit $IV_{11}$. Therefore, the output pulses of the CMOS inverter circuit $IV_{12}$ are intermittent. The rectification circuit $CPC_2$ is therefore operated intermittently in accordance with the output of the inverter circuit $IV_{12}$.

The current supply capacity of the rectification circuit $CPC_1$ exhibiting the steady operation to the semiconductor substrate may be small in the same way as in the foregoing embodiments. Therefore, the charge pump capacitor $C_3$ may also be relatively small.

The charge pump capacitor in the rectification circuit $CPC_2$, exhibiting the intermittent operation, is relatively large.

Though not particularly limited to this configuration, capacitors $C_3$ and $C_4$ are formed in an N-type region (not shown) that is in turn formed on the surface of the p-type semiconductor substrate, and have a construction similar to that of the P-channel MOSFET. The N-type well region in which these capacitors $C_3$ and $C_4$ are formed is held at the potential of the power terminal $V_{cc}$ of the circuit, for example.. This construction is somewhat advantageous for reducing the substrate leakage current.

In accordance with this embodiment, the oscillation circuit OSC is common to the rectification circuits $CPC_1$ and $CPC_2$. As described already, the bias current supplied to the semiconductor substrate is associated with the operating frequency of the rectification circuit. The oscillation frequency of the oscillation circuit OSC is determined by the current supply capacity provided by the rectification circuit $CPC_1$ of the steady operation and by the current supply capacity provided by the rectification circuit $CPC_2$ of the intermittent operation. Therefore, the lower limit of the oscillation frequency of the oscillation circuit OSC is somewhat limited in comparison with that of the oscillation circuit $OSC_2$ of the steady operation shown in FIG. 2.

However, this embodiment does not include an oscillation circuit which consumes power during the operation of its own, such as the oscillation circuit $OSC_1$ of the intermittent operation shown in FIG. 2.

Therefore, the number of necessary circuit elements can be reduced. Furthermore, the average power consumption of the RAM as a whole can be sufficiently reduced even when the power consumed by the common oscillation circuit OSC is somewhat greater than that of the oscillation circuit $OSC_2$ of FIG. 2, for example.

[Embodiment 4]

Figure 6:
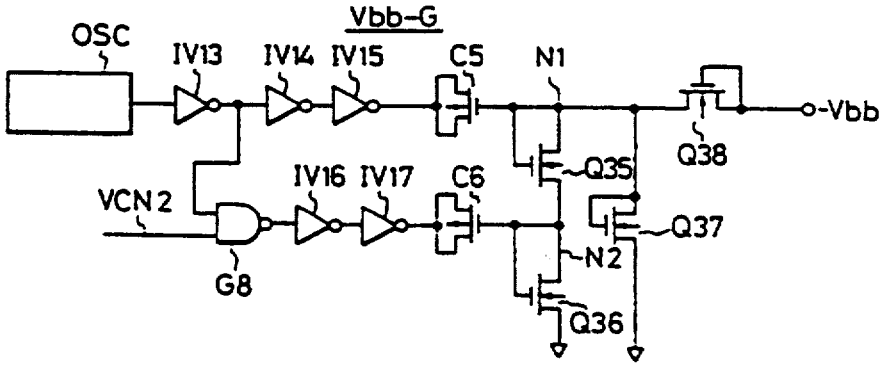

FIG. 6 is a circuit diagram of the substrate bias voltage generation circuit $V_{bb}$-G in accordance with still another embodiment of the present invention.

The substrate bias voltage generation circuit $V_{bb}$-G of this embodiment comprises of the oscillation circuit OSC, a CMOS inverter circuit $IV_3$ which act as a waveform shaping circuit, a CMOS NAND gate circuit $G_8$, CMOS inverter circuits $IV_{14}$ and $IV_{16}$, CMOS inverter circuits $IV_{15}$ and $IV_{17}$ which act as buffer amplifier, charge pump capacitors $C_5$ and $C_6$ and N-channel MOSFETs $Q_{35}$ through $Q_{38}$ as rectification elements.

The circuit operation, when the control signal $VCN_2$ formed in combination with the detection output of the level detection circuit and the control signal of the dynamic RAM as in the foregoing embodiment is at the low level, is as follows.

The outputs of the gate circuit $G_8$ and inverter circuit $IV_{17}$ are at the high level irrespective of the output of the oscillation circuit OSC. The capacitor $C_6$ is under the charge state by the high level output of the inverter $IV_{17}$.

The output of the inverter $IV_{15}$ is charged to the high and low levels in accordance with the output of the oscillation circuit OSC. Under this state, the rectification circuit comprising of the capacitor $C_5$ and the MOSFETs $Q_{37}$ and $Q_{38}$ is operated, and the back-bias voltage—$V_{66}$ is supplied to the semiconductor substrate in response thereto. The MOSFET $Q_{35}$ is kept substantially OFF because the maximum positive potential level appearing at the node $N_1$ is clamped by the MOSFET $Q_{37}$ as the rectification element.

The circuit operation when the control signal $VCN_2$ is at the high level is as follows.

When the output of the inverter circuit $IV_{13}$ is raised to the high level in accordance with the output of the oscillation circuit OSC, the output of the inverter circuit $IV_{15}$ is raised to the high level substantially equal to the power source voltage $V_{cc}$ in response thereto, while the output of the inverter circuit $IV_{17}$ is lowered to the low level substantially equal to 0 V. Since the capacitor $C_6$ is charged in advance, the node $N_2$ is set to the negative potential when the output of the inverter circuit $IV_{17}$ is lowered to the low level. As the node $N_2$ is thus at the negative potential, the MOSFET $Q_{35}$ as the rectification element is rendered conductive. As a result, the negative potential formed by the capacitor $C_6$ is transmitted to the node $N_1$ through the MOSFET $Q_{35}$. The capacitor $C_5$ is charged by the high level produced from the inverter circuit $IV_{15}$ and by the negative potential applied to the node $N_1$ to such a high level as to exceed the power source voltage $V_{cc}$. In other words, the capacitor $C_6$ is operated substantially as a bootstrap capacitor and the charging voltage of the capacitor $C_5$ is at the boost level.

Next, when the output of the inverter circuit $IV_{13}$ is lowered to the low level, the output of the inverter circuit $IV_{15}$ is lowered to the low level substantially equal to 0 V in response thereto. Since the capacitor $C_5$ is charged in advance to the boost level, the node $N_1$ is set to a large negative potential in response to the drop of the output of the inverter circuit $IV_{15}$ to the low level. The potential of this node $N_1$ is supplied to the semiconductor substrate via the MOSFET $Q_{38}$. The output of the inverter circuit $IV_{17}$ is raised to the high level substantially equal to the power source voltage in accordance with the low level output of the inverter circuit $IV_{13}$. The MOSFET $Q_{36}$ is rendered conductive by the positive potential given to the node $N_2$ through the capacitor $C_6$. As a result, the capacitor $C_6$ is charged again.

The operation described above are repeated in accordance with the change of the output of the inverter circuit $IV_{13}$. As a result, a large bias current is supplied to the semiconductor substrate within a period in which the control signal $VCN_2$ is at the high level.

In accordance with this embodiment, the two inverter circuit $IV_{15}$ and $IV_{17}$ having a relatively large driving capacity are operated so as to complement each other so that the transient current flowing through the power source wiring inside the RAM can be reduced, and noise in the power source wiring can be therefore reduced.

[EFFECTS]

(1) The operations of the oscillation circuit for forming the back-bias voltage and its rectification circuit are selectively stopped by monitoring the level of the back-bias voltage, so that the consumption of substantially wasted current can be restricted. As a result, the lower power consumption of a semiconductor integrated circuit device with the built-in substrate back-bias voltage generation circuit can be accomplished.

(2) The present invention disposes the substrate back-bias voltage generation circuit having only such a small current supply capacity that compensates for a leakage current at the time of non-selection, and another substrate back-bias voltage generation circuit which is selectively operated by the level monitor output of the substrate back-bias voltage. In addition, the invention makes invalid the monitor output when the internal circuits are operated. According to this arrangement, a substrate back-bias voltage which is at a substantially constant level can be formed with reduced power consumption.

(3) Due to the effects (1) and (2), the power consumption of the substrate bias voltage generation circuit can be reduced, so that the service life of a battery at the time of the battery back-up operation can be extended.

(4) A level limiter operation of the P-channel MOSFETs to the gates of which the ground potential of the circuit is supplied and the N-channel MOSFETs in the diode form can detect the level of a negative voltage with respect to the ground potential as the reference by using substantially the positive power source voltage $V_{cc}$ alone, with a simple circuit construction.

Though the invention has thus been described definitely with reference to some referred embodiments thereof, the invention is not particularly limited thereto, but can of course be modified or changed in various manners without departing from the gist thereof. For example, in those semiconductor integrated circuit devices which are made operative by chip selection signals such as in RAMs, the monitor output of the substrate back-bias voltage may be made invalid by the chip selection signal in place of the internal control signal $RAS_1$ in the circuit embodiment shown in FIG. 2. The oscillation circuit which is operated steadily by turning on the power source voltage and its rectification circuit are not essentially necessary.

The circuit construction in which the substrate bias generation circuit is divided into the circuit portion exhibiting the steady operation and the circuit portion exhibiting the intermittent operation is desirable from the aspect of the prevention of the unnecessary increase of the sizes of the circuit elements forming the circuit portion exhibiting the intermittent operation. If necessary, however, the circuit having a small current supply capacity and the circuit having a large current supply capacity may be operated selectively. A plurality of circuit portions exhibiting the intermittent operation may be disposed and may be controlled individually.

In the present invention, the term "substrate" of the "substrate bias generation circuit" means one semiconductor region such as the substrate gate of a field effect element but is not intended to mean only a semiconductor substrate. For example, if a memory cell is formed in a P-type well region formed on the surface of an N-type semiconductor substrate in order to reduce the soft error of the memory resulting from $\alpha$ rays and the back-bias voltage is applied to the P-type well region, the term "substrate" means that P-type well region.

In addition to the use of dummy cells, the reference voltage for reading out the memory cells constituting the dynamic RAM may be formed by short-circuiting the complementary data lines that are at the high and low levels under the high impedance state, without using the dummy cells. The reference voltage in this case is at the intermediate level. Various other circuit constructions may further be employed. For example, peripheral circuits such as the address buffers, the address decoders, and the like may be constituted by CMOS static circuits. The X and Y address signals may be supplied from mutually independent external terminals and a detection circuit for detecting the change timing of the address signal is disposed in order to generate various timing signals necessary for the operations of the internal circuits.

Besides the semiconductor memories such as the dynamic RAMs and the static RAMs described above, the present invention can be applied widely to semiconductor integrated circuit devices equipped with a built-in substrate bias generation circuit.

What is claimed is:

1. A semiconductor memory device comprises of at least an insulated gate field effect transistor having a substrate gate to which a back-bias voltage is supplied, wherein said semiconductor memory comprises:

word lines;

data lines;

memory cells disposed to correspond to points of intersection between said word lines and said data lines, wherein each of said memory cells includes a capacitor coupled to a MOSFET, for storing a data signal;

a first selecting means for selecting one of said word lines;

a second selecting means for selecting one of said data lines;

an output means for outputting a data signal stored in a memory cell which is selected by said first and second selecting means;

a back-bias voltage generation means for generating said back-bias voltage; and a level detection means for detecting a level of said back-bias voltage produced by said back-bias voltage generation means, wherein said back-bias voltage generation means includes a first means for generating said back-bias voltage in response to pulse signals, and a second means controlled in response to an output of said level detection means, for generating said pulse signals, 2. A semiconductor memory device according to claim 1, wherein said level detection includes a level discrimination means, a level shift means disposed between an input terminal of said level discrimination means and said substrate gate and supplying a voltage level-shifted by a predetermined level with respect to said back-bias voltage to the input of said level discrimination means, and a bias element forming a bias current for said level shift means.

3. A semiconductor memory device according to claim 2, wherein said first means includes a capacitor and a plurality of rectification elements.

4. A semiconductor memory device according to claim 3, wherein said second means includes a ring oscillator forming a feedback loop in response to said output of said level detection means.

5. A semiconductor memory device according to claim 1, wherein said MOSFETs of said memory cells have a substrate gate to which said back-bias voltage is supplied.

6. A semiconductor memory device comprised of at least an insulated gate field effect transistor having a substrate gate to which a back-bias voltage is supplied, wherein an operation of said semiconductor memory device is controlled by a control signal, wherein said semiconductor memory device comprises:

a plurality of word lines;

a plurality of data lines;

a plurality of memory cells disposed to correspond to points of intersection between said word lines and said data lines, wherein each of said memory cells includes a capacitor coupled to a MOSFET, for storing a data signal;

a first selecting means for selecting one of said word lines;

a second selecting means for selecting one of said data lines;

an output means for outputting a data signal stored in a memory cell which is selected by said first and second selecting means; and a back-bias voltage generation means for generating said back-bias voltage, wherein said back-bias voltage generation means includes a level detection means for detecting a level of said back-bias voltage, a rectification means including a capacitor and a rectification elements, said rectification means receiving pulse signals generated by an oscillation means, a control means coupled between said rectification means and said oscillation means, for controlling said pulse signals supplied to said rectification means in response to a control signal and a detection signal provided from said level detection means.

7. A semiconductor memory device according to claim 6, wherein said MOSFETs of said memory cells have a substrate gate to which said back-bias voltage is supplied.

8. A semiconductor memory device according to claim 6, wherein said control means includes a gate means for inhibiting the application of said pulse signals to said rectification means on the basis of said control signal and said detection signal.

9. A semiconductor memory device according to claim 8, wherein said level detection means includes a level shift circuit for generating a level-shifted output voltage with respect to said back-bias voltage upon receiving said back-bias voltage, and a level discrimination circuit receiving the output of said level shift circuit.

10. A semiconductor memory device according to claim 9, wherein said level shift circuit includes a plurality of series-connected level shift elements each of which includes a diode-connected insulated gate field effect transistor, and a bias element.

11. A semiconductor memory device according to claim 8, wherein said gate means inhibits the application of said pulse signals to said rectification means when said semiconductor memory device is made inoperative by said control signal and when said detection signal is not generated from said level detection means.

12. A semiconductor memory device according to claim 11, wherein said control signal includes at least a chip selection signal.

13. A semiconductor memory device according to claim 12, wherein said semiconductor memory device is a dynamic type random access memory, and said control signal includes at least a row address strobe signal.

14. A semiconductor memory device according to claim 13, wherein said control signal further includes a refresh control signal.

15. A semiconductor memory device comprised of at least an insulated gate field effect transistor having a substrate gate to which a back-bias voltage is supplied, wherein said semiconductor memory device comprises:

a plurality of word lines;

a plurality of data lines;

a plurality of memory cells disposed to correspond to points of intersection between said word lines and said data lines, wherein each of said memory cells includes a capacitor coupled to a MOSFET, for storing a data signal;

a first selecting means for selecting one of said word lines;

a second selecting means for selecting one of said data lines;

an output means for outputting a data signal stored in a memory cell which is selected by said first and second selecting means; and a back-bias voltage generation means for generating said back-bias voltage, wherein said back-bias generating means comprises a level detection means for detecting a level of said back-bias voltage, a first rectification means comprising a capacitor and a plurality of rectification elements, a second rectification means comprising a capacitor and a plurality of rectification elements, a control means for controlling pulse signals supplied to said second rectification means on the basis of a detection signal provided from said level detection means, and a common oscillation means generating pulse signals to be supplied to said first and second rectification means.

16. A semiconductor memory device according to claim 15, wherein an operation of said semiconductor device is controlled by a control signal wherein said control means includes a gate circuit coupled between said second rectification means and said common oscillation means, for inhibiting the operation of said second rectification means, and wherein the operation of said gate circuit is controlled by said control signal and said detection signal so that the voltage output capacity of said back-bias voltage generating means is changed in synchronism with the operating state of said semiconductor memory device.

17. A semiconductor memory device according to claim 16, wherein said gate circuit inhibits the operation of said second rectification means when said semiconductor memory device is made inoperative by a control signal and when the detection signal is not generated from said level detection means.

18. A semiconductor memory device according to claim 17, wherein said level detection means comprises a level shift circuit generating an output voltage level-shifted with respect to said back-bias voltage upon receiving said back-bias voltage, and a level discrimination circuit receiving the output of said level shift circuit.

19. A semiconductor memory device according to claim 18, wherein said level shift circuit comprises a plurality of level shift elements, each of which is comprised of an insulated gate field effect transistor, that are connected in series with one another, and a bias element applying a bias current to said level shift elements.

20. A semiconductor memory device according to claim 19, wherein said control signal includes at least a chip selection signal.

21. A semiconductor memory device according to claim 19, wherein said semiconductor memory device is a dynamic type random access memory, and said control signal includes at least a row address strobe signal.

22. A semiconductor memory device according to claim 15, wherein said MOSFETs of said memory cells have a substrate gate to which said back-bias voltage is supplied.

23. A semiconductor memory device comprises of at least an insulated gate field effect transistor having a substrate gate to which a back-bias voltage is supplied, wherein said semiconductor memory device comprises:

a plurality of word lines;

a plurality of date lines;

a plurality of memory cells disposed to correspond to points of intersection between said word lines and data lines, wherein each of said memory cells includes a capacitor coupled to a MOSFET, for storing a data signal;

a first selecting means for selecting one of said word lines;

a second selecting means for selecting one of said data lines;

an output means for outputting a data signal stored in a memory cell which is selected by said first and second selecting means; and a back-bias voltage generation means for generating said back-bias voltage, wherein said back-bias voltage generation means comprises a level detection means for detecting a level of said back-bias voltage, a first rectification means comprising a capacitor and a rectification element, said first rectification means receiving periodic pulse signals, a second rectification means comprising a capacitor and a rectification element and a control means for controlling pulse signals supplied to said second rectification means on the basis of a detection signal provided from said level detection means, a first oscillation means for generating pulse signals to be supplied to said first rectification means and a second oscillation means having the operation thereof controlled in response to an operation control signal produced from said control means and generating pulse signals to be supplied to said second rectification means.

24. A semiconductor memory device according to claim 23, wherein said control means generates said operation control signal for making said second oscillation means operative during a period in which said level detection means generates said detection signal.

25. A semiconductor memory device according to claim 24, wherein said level detection means comprises a level shift circuit for generating a level-shifted output voltage with respect to said back-bias voltage upon receiving said back-bias voltage, and a level discrimination circuit receiving the output of said level shift circuit.

26. A semiconductor memory device according to claim 25, wherein said level shift circuit comprises a plurality of series-connected level shift element each of which includes a diode-connected insulated gate field effect transistor, and a bias element.

27. A semiconductor memory device according to claim 26, wherein said level discrimination circuit comprises a hysteresis circuit.

28. A semiconductor memory device according to claim 23, wherein an operation of said semiconductor memory device is controlled by a control signal, wherein said control means further controls said pulse signals supplied to said second rectification means on the basis of said control signal, and said control signal comprises at least a chip selection signal.

29. A semiconductor memory device according to claim 28, wherein said semiconductor memory device is a dynamic type random access memory, wherein said dynamic type random access memory is rendered operative at a time of chip selection determined by said chip selection signal and at a time of refresh operation determined by a refresh control signal, and said control means generates said operation control signal for making said second oscillation means operative in synchronism with the operative state of said dynamic type random access memory, on the basis of said chip selection signal and said refresh control signal.

30. A semiconductor memory device according to claim 29, wherein said control means generates said operation control signal for making said second oscillation means operative during a period in which said dynamic type random access memory is made operative on the basis of said chip selection signal and said refresh control signal, and during a period in which the detection signal is generated from said level detection means.

31. A semiconductor memory device according to claim 23, wherein said first oscillation means generates said pulse signal when said second oscillation means operates, and wherein the oscillation frequency of said first oscillation means is lower than that of said second oscillation means.

32. A semiconductor memory device according to claim 31, wherein said second oscillation means comprises a ring oscillator forming a feedback loop on the basis of said detection signal.

33. A semiconductor memory device according to claim 23, wherein said MOSFETs of said memory cells have a substrate gate to which said back-bias voltage is supplied.

34. A semiconductor memory device comprised of at least an insulated gate field effect transistor having a substrate response to a second level of said pulse signal, a first switch means connected to said first node and forming a pre-charge path for said first capacitor, a second switch means disposed between said first node and said substrate gate and caused to operate substantially complementarily with respect to said first switch means, and a second capacitor increasing the pre-charge level of said first capacitor when said semiconductor memory device is made operative in response to said control signal gate to which a back-bias voltage is supplied, wherein an operation of said semi-conductor memory device is controlled by a control signal, wherein said semiconductor memory device comprises:

a plurality of word lines;

a plurality of data lines;

a plurality of memory cells disposed to correspond to points of intersection between said word lines and said data lines, wherein each of said memory cells includes a capacitor coupled to a MOSFET, for storing a data signal;

a first selecting means for selecting one of said word lines;

a second selecting means for selecting one of said data lines;

an output means for outputting a data signal stored in a memory cell which is selected by said first and second selecting means; and a back-bias voltage generation means for generating said back-bias voltage, wherein the operation of said back-bias voltage generation means is controlled on the basis of said control signal so that the voltage output capacity of said back-bias voltage generation means is changed in synchronism with the operating state of said semiconductor memory device, wherein said back-bias voltage generation means comprises a first capacitor which is pre-charged in response to a first level of a periodic pulse signal and applies a bias potential to be supplied to said substrate gate to a first node in response to a second level of said pulse signal, a first switch means connected to said first node and forming a pre-charge path for said first capacitor, a second switch means disposed between said first node and said substrate gate and caused to operate substantially complementarily with respect to said first switch means, and a second capacitor increasing the pre-charge level of said first capacitor when said semiconductor memory device is made operative in response to said control signal.

*35. A semiconductor memory device according to claim 2, wherein said first means includes a first buffer circuit having a first inverter circuit receiving said pulse signals, a first rectification circuit having a first capacitor receiving an output of said first inverter circuit and a rectification element coupled to said first capacitor, a second buffer circuit having a second inverter circuit receiving said pulse signals and a second rectification circuit having a second capacitor receiving an output of said second inverter circuit and a rectification element coupled to said second capacitor,*

*wherein a driving capacity of said first inverter circuit is lower than a driving capacity of said second inverter circuit.*

*36. A semiconductor memory device according to claim 35, wherein a capacitance of said first capacitor is smaller than a capacitance of said second capacitor.*

*37. A semiconductor memory device according to claim 36, wherein a first buffer circuit is operated steadily by receiving said pulse signals.*

*38. A semiconductor memory device according to claim 35, wherein said first buffer circuit is operated steadily by receiving said pulse signals.*

*39. A semiconductor memory device according to claim 15, further comprising:*

*a first buffer circuit having a first inverter circuit coupled between said common oscillation means and said capacitor in said first rectification means; and*

*a second buffer circuit having a second inverter circuit coupled between said common oscillation means and said capacitor in said second rectification means,*

*wherein a driving capacity of said first inverter circuit is lower than a driving capacity of said second inverter circuit.*

*40. A semiconductor memory device according to claim 39, wherein a capacitance of said capacitor in said first rectification means is smaller than a capacitance of said capacitor in said second rectification means.*

*41. A semiconductor memory device according to claim 40, wherein said first buffer circuit is operated steadily by receiving said pulse signals.*

*42. A semiconductor memory device according to claim 39, wherein said first buffer circuit is operated steadily by receiving said pulse signals.*

*43. A semiconductor memory device according to claim 20, further comprising:*

*a first buffer circuit having a first inverter circuit coupled between said common oscillation means and said capacitor in said first rectification means; and*

*a second buffer circuit having a second inverter circuit coupled between said common oscillation means and said capacitor in said second rectification means,*

*wherein a driving capacity of said first inverter circuit is lower than a driving capacity of said second inverter circuit.*

*44. A semiconductor memory device according to claim 43, wherein a capacitance of said capacitor in said first rectification means is smaller than a capacitance of said capacitor in said second rectification means.*

*45. A semiconductor memory device according to claim 44, wherein said first buffer circuit is operated steadily by receiving said pulse signals.*

*46. A semiconductor memory device according to claim 43, wherein said first buffer circuit is operated steadily by receiving said pulse signals.*

*47. A semiconductor memory device according to claim 23, further comprising:*

*a first buffer circuit having a first inverter circuit provided between said first oscillation means and said capacitor in said first rectification means; and*

*a second buffer circuit having a second inverter circuit provided between said second oscillation means and said capacitor in said second rectification means,*

*wherein a driving capacity of said first inverter circuit is lower than a driving capacity of said second inverter circuit.*

*48. A semiconductor memory device according to claim 47, wherein a capacitance of said capacitor in said first rectification means is smaller than a capacitance of said capacitor in said second rectification means.*

*49. A semiconductor memory device according to claim 48, wherein said first buffer circuit is operated steadily by receiving said pulse signals.*

*50. A semiconductor memory device according to claim 49, wherein said first buffer circuit is operated steadily by receiving said pulse signals.*

*51. A semiconductor memory device according to claim 28, further comprising:*

*a first buffer circuit having a first inverter circuit coupled between said first oscillation means and said capacitor in said first rectification means; and*

*a second buffer circuit having a second inverter circuit coupled between said second oscillation means and said capacitor in said second rectification means,*

*wherein a driving capacity of said first inverter circuit is lower than a driving capacity of said second inverter circuit.*

*52. A semiconductor memory device according to claim 51, wherein a capacitance of said capacitor in said first rectification means is smaller than a capacitance of said capacitor in said second rectification means.*

*53. A semiconductor memory device according to claim 52, wherein said first buffer circuit is operated steadily by receiving said pulse signals.*

*54. A semiconductor memory device according to claim 51, wherein said first buffer circuit is operated steadily by receiving said pulse signals.*

*55. A semiconductor memory device according to claim 51, wherein said first and second capacitors are formed by P-channel MOSFETs which are formed in an N-type well region on the surface of the P-type semiconductor substrate, and wherein said N-type well region is held at the potential of the power source voltage.*

*56. A semiconductor memory device comprising:*

*a first circuit which includes an insulated gate field effect transistor having a substrate gate to which a back-bias voltage is supplied; and*

*back-bias voltage generation means for generating said back-bias voltage,*

*wherein said back-bias voltage generation means includes a level detection circuit for detecting a level of said back-bias voltage, a first rectification circuit which has a first capacitor receiving a pulse signal, a second rectification circuit which has a second capacitor receiving a pulse signal and control means for controlling said pulse signal supplied to said second rectification means on the basis of a detection signal provided from said level detection circuit.*

*57. A semiconductor memory device according to claim 56, further comprising:*

*a first buffer circuit having a first inverter circuit supplying said first capacitor with said pulse signal; and*

*a second buffer circuit having a second inverter circuit supplying said second capacitor with said pulse signal,*

*wherein a driving capacity of said first inverter circuit is lower than a driving capacity of said second inverter circuit.*

*58. A semiconductor memory device according to claim 57, wherein a capacitance of said capacitor in said first rectification means is smaller than a capacitance of said capacitor in said second rectification means.*

*59. A semiconductor memory device according to claim 58, wherein said first rectification circuit is operated steadily by receiving said pulse signals.*

*60. A semiconductor memory device according to claim 59, further comprising:*

*first oscillation means for generating said pulse signal to be supplied to said first capacitor via said first buffer circuit; and*

*second oscillation means for generating said pulse signal to be supplied to said second capacitor via said second buffer circuit.*

* * * * *

UNITED STATES PATENT AND TRADEMARK OFFICE

CERTIFICATE OF CORRECTION

PATENT NO. : RE 34,797

DATED : November 22, 1994

INVENTOR(S) : K. SATO et al.

It is certified that error appears in the above-identified patent and that said Letters Patent is hereby corrected as shown below:

The title page of the patent should indicate the following:

-- Foreign Application Priority Data

Aug. 31, 1984 [JP] Japan ..... 59-180534 --

Signed and Sealed this

Nineteenth Day of May, 1998

Bruce Lehman

*Attest:*

BRUCE LEHMAN

*Attesting Officer*

*Commissioner of Patents and Trademarks*